United States Patent
Baldwin, Jr. et al.

(10) Patent No.: US 6,280,563 B1
(45) Date of Patent: Aug. 28, 2001

(54) PLASMA DEVICE INCLUDING A POWERED NON-MAGNETIC METAL MEMBER BETWEEN A PLASMA AC EXCITATION SOURCE AND THE PLASMA

(75) Inventors: Scott K. Baldwin, Jr., San Jose; Michael S. Barnes, San Ramon; John P. Holland, Santa Clara, all of CA (US)

(73) Assignee: Lam Research Corporation, Fremont, CA (US)

(*) Notice: Subject to any disclaimer, the term of this patent is extended or adjusted under 35 U.S.C. 154(b) by 0 days.

(21) Appl. No.: 09/001,512

(22) Filed: Dec. 31, 1997

(51) Int. Cl.[7] .............. C23F 1/02; C23C 14/34; C23C 16/00
(52) U.S. Cl. .............. 156/345; 118/723 I; 204/298.06; 204/298.08; 204/298.11; 204/298.34
(58) Field of Search ............ 204/298.06, 298.08, 204/298.11, 298.12, 298.34; 156/345; 118/723 I

(56) References Cited

U.S. PATENT DOCUMENTS

| | | | |
|---|---|---|---|
| 4,013,533 | * 3/1977 | Cohen-Solal et al. | 204/192 S |
| 4,595,482 | * 6/1986 | Mintz | 204/298 |
| 4,853,102 | * 8/1989 | Tateishi et al. | 204/298 |
| 4,990,229 | * 2/1991 | Campbell et al. | 204/298.06 |
| 5,122,251 | * 6/1992 | Campbell et al. | 204/298.06 |
| 5,178,739 | * 1/1993 | Barnes et al. | 204/192.12 |
| 5,234,529 | 8/1993 | Johnson | 156/345 |
| 5,449,433 | 9/1995 | Donohoe | 156/643.1 |
| 5,514,246 | 5/1996 | Blalock | 118/723 I |
| 5,523,261 | 6/1996 | Sandhu | 437/228 |
| 5,558,722 | * 9/1996 | Okumura et al. | 118/723 I |
| 5,565,074 | * 10/1996 | Qian et al. | 204/298.08 |
| 5,619,103 | * 4/1997 | Tobin et al. | 315/111.21 |
| 5,647,913 | 7/1997 | Blalock | 156/643.1 |
| 5,650,032 | 7/1997 | Keller et al. | 156/345 |
| 5,779,849 | 7/1998 | Blalock | 156/345 |
| 5,948,215 | * 9/1999 | Lantsman | 204/192.12 |
| 5,964,989 | * 10/1999 | Nakao | 204/192.12 |
| 6,068,784 | * 5/2000 | Collins et al. | 216/68 |
| 6,077,384 | * 6/2000 | Collins et al. | 156/345 |

FOREIGN PATENT DOCUMENTS

| | | | |
|---|---|---|---|
| 0607797A1 | 7/1994 | (EP) | H01J/37/32 |
| WO 97/08734 | 3/1997 | (WO) | H01J/37/32 |
| WO 98/48444 | 10/1998 | (WO) | H01J/37/34 |

OTHER PUBLICATIONS

JP 60–136230 Abstract, Jul. 1985.*

* cited by examiner

Primary Examiner—Nam Nguyen
Assistant Examiner—Steven H. VerSteeg
(74) Attorney, Agent, or Firm—Lowe Hauptman; Gilman & Berner, LLP

(57) ABSTRACT

A plasma processor for a workpiece includes a coil for supplying an r.f. exciting field through a window to a plasma in a vacuum chamber. A powered non-magnetic metal member between the coil and plasma couples the field to the plasma. In first and second embodiments, the metal member is respectively (1) a plate abutting a face of the window inside the chamber and (2) a thin film on an interior face of the window. In a third embodiment, the plate and film are both used. All embodiments help to ignite the plasma. The second embodiment increases plasma stability and prevents window clouding by ionized plasma particles. Metal from the plate is sputtered as a deposit onto the workpiece. The third embodiment enables substantially simultaneous depositing and cleaning.

27 Claims, 4 Drawing Sheets

PLASMA DEVICE INCLUDING A POWERED NON-MAGNETIC METAL MEMBER BETWEEN A PLASMA AC EXCITATION SOURCE AND THE PLASMA

FIELD OF THE INVENTION

The present invention relates to AC excited plasma devices in a vacuum chamber having a metal wall at a reference potential and more particularly to such devices wherein a powered non-magnetic metal member that can pass a magnetic field of the AC excitation is at a potential different from the reference potential and is located between a source of the excitation and the plasma.

BACKGROUND ART

One type of plasma device includes a vacuum chamber having a metal wall and base at ground, i.e. a reference, potential. A plasma is formed in the vacuum chamber in response to AC excitation, typically from an r.f. or microwave source. The r.f. excitation is, in some types of devices, derived from a coil having turns extending radially and circumferentially, such as a circular or "rectangular" spiral. Magnetic and electric r.f. fields from the coil are coupled to ionizable material (usually a gas) in the vacuum chamber to form the plasma. The plasma is incident on a workpiece, such as a circular semiconductor wafer or a rectangular, glass sheet used in a flat panel display. The plasma etches material from or deposits material onto the workpiece. The periphery of the coil has a size and shape generally corresponding with the workpiece peripheral size and shape. Typically, the coil is located outside the vacuum chamber to derive r.f. magnetic and electric fields coupled to the ionizable material in the vacuum chamber through a dielectric window of the vacuum chamber. In many instances, the workpiece is mounted on a metal chuck biased by an r.f. source to attract charge particles in the plasma to the workpiece.

Other systems have been proposed in which a coil is immersed in the vacuum chamber, so that the plasma surrounds at least part of the coil. Such immersed coils are resistively coupled to the plasma since the main impedance component of the plasma is resistive and the plasma contacts the coil. In contrast, coils located outside the chamber and coupled to the plasma through the dielectric window are reactively coupled to the plasma by the electric and magnetic fields. Locating the coil outside of the vacuum chamber results in more efficient coupling of magnetic fields to the plasma than is achieved by an immersed coil. The immersed coil experiences greater power losses than the external coil because of capacitive coupling between the immersed coil and the plasma. This is because the plasma excited by the immersed coil has a lower flux density than the plasma established by the external coil. The high flux density plasma which is established by the external coil leads directly to high deposition and etching rates of plasma materials on the workpiece.

In the past, materials have been deposited on workpieces in vacuum plasma processing chambers by chemical vapor deposition (CVD) processes carried out in the presence of r.f. and microwave excited plasmas. Molecules containing atoms desirably deposited on the workpiece are introduced into the vacuum chamber and chemically reacted with the assistance of the plasma to dissociate the desired atoms from the remainder of the molecules. The desired atoms are frequently in complicated organic molecules including many atoms other than the atoms desirably deposited on the workpiece. Many of the atoms in the molecules, other than those desirably deposited on the workpiece, are frequently deposited on the workpiece, whereby the workpiece has a tendency to be contaminated with such atoms.

Plasmas excited by magnetic fields resulting from r.f. coil excitation are prone to instability. The magnetic fields typically operate on relatively low energy electrons. Relatively small fluctuations of the density of these low energy electrons and/or the temperature of the electrons affects coupling of the magnetic fields to the electrons, resulting in relatively large amplitude plasma impedance variations. These relatively large plasma impedance fluctuations are coupled to the coil and circuitry driving the coil, including a matching network connected between the coil and r.f. source. The plasma impedance fluctuations can be so severe as to cause plasma extinction. In any event, the instability of plasmas excited predominantly by magnetic fields, i.e., fields inductively coupled from a coil to the plasma, is a problem that has hampered operation of some coil-excited r.f. plasmas.

Inductively excited r.f. plasmas responsive to fields derived from coils are frequently difficult to ignite. To ignite ionizable gas in the vacuum chamber into a plasma discharge, relatively high voltages often must be applied to the coil to produce sufficiently high electric fields that are coupled from the coil to the plasma. The load seen by the coil prior to the plasma discharge being established is essentially capacitive but becomes primarily resistive when plasma ignition occurs. The sudden change in the impedance seen by the coil requires substantial changes in the matching network connected between the coil and the r.f. excitation source. Hence, it is desirable to provide some way of reducing the voltage necessary to achieve plasma ignition.

Dielectric windows of coil-driven r.f. plasma processors have a tendency to be clouded by material from the plasma being incident on the insides of the windows. The materials can be polymers from organic molecules etched from the workpiece or metal particles dissociated from molecules involved in chemical vapor deposition and other processes. Formation of the polymer on the dielectric window is undesirable since the deposition of the polymers on the window can lead to formation of particulates that lead to workpiece contamination. Clouding of the window by the metal adversely affects coupling of the r.f. fields from the coil external to the processor chamber through the window to the plasma. Typically, the prior art has dealt with this problem by opening the vacuum chamber and cleaning the window and the rest of the chamber interior or by using in situ methods which are performed under vacuum conditions, at times when processing operations are not performed. Consequently, substantial processor down time occurs as a result of the cleaning activities.

It is, accordingly, an object of the present invention to provide a new and improved vacuum plasma device.

Another object of the invention is to provide a new and improved apparatus for and method of depositing a non-magnetic metal on a workpiece in a vacuum plasma processing chamber.

A further object of the invention is to provide a new and improved apparatus for and method of depositing a non-magnetic metal on a workpiece in an r.f. plasma vacuum plasma processor wherein the deposit is substantially devoid of impurities and consists substantially only of the metal.

An additional object of the invention is to provide a new and improved apparatus for and method of igniting an ionizable gas to an a.c. plasma.

Still an additional object of the invention is to provide a new and improved apparatus for and method of stabilizing an r.f. coil-excited plasma in a vacuum chamber.

Yet a further object of the invention is to provide a new and improved apparatus for and method of cleaning a dielectric window of a vacuum processing chamber having an r.f. coil-excited plasma.

An added object of the invention is to provide a new and improved apparatus for and method of cleaning a dielectric window of a vacuum processing chamber having an r.f. coil-excited plasma wherein the window is cleaned substantially at the same time as plasma processing of a workpiece in the chamber.

Still another object of the invention is to provide a new and improved apparatus for and method of removing polymers etched from a processed workpiece from a dielectric window of a vacuum plasma processing chamber.

Still yet another object of the invention is to provide a new and improved vacuum plasma processor wherein non-magnetic metal deposited on a workpiece in the processor is removed from a dielectric window of the processor at substantially the same time as deposition of the metal on the workpiece, and to a method of obtaining such results.

SUMMARY OF THE INVENTION

In accordance with the present invention, the foregoing objects are achieved, inter alia, with a plasma device comprising (1) a vacuum chamber having a metal wall at a reference potential, (2) AC excitation source reactively coupled to ionizable material in the chamber so AC energy from the source interacts with the ionizable material to form a plasma, and (3) a powered non-magnetic metal member interposed between the AC excitation source and the plasma. The non-magnetic metal member is arranged and constructed to pass AC electromagnetic fields from the source to the plasma. The non-magnetic member is powered by being connected to a terminal of an electric source at a potential different from the reference potential. The device is preferably a processor for a workpiece, in which case the chamber includes a holder for the plasma- processed workpiece.

In a preferred embodiment, the AC source includes a coil outside the chamber powered by an RF source. The coil derives an RF field coupled to the plasma through a dielectric window of the chamber and the non-magnetic metal member.

In one aspect, the non-magnetic metal member is inside the chamber and comprises a consumable solid mounted for replacement in the chamber. The non-magnetic metal member abuts the window to prevent formation of a secondary plasma between the metal member and the window.

In another aspect, the non-magnetic metal member is outside the chamber. Preferably such a non-magnetic metal member abuts the window and comprises a film on the window.

In a further aspect a first non-magnetic member is inside the chamber and a second non-magnetic member is outside the chamber.

The non-magnetic member or members include openings for disrupting eddy currents having a tendency to flow therein in response to magnetic fields derived by the coil. If the first and second members are included, the openings in the first and second members are preferably non-aligned to enhance magnetic and electric field coupling from the coil to the plasma. The first and second non-magnetic members are preferably connected to electric source terminals causing the first non-magnetic metal member to be at a first potential relative to the reference potential and the second non-magnetic member to be at a second potential relative to the reference potential; the first potential is substantially greater than the second potential.

A further aspect of the invention is related to a method of depositing a non-magnetic metal on a workpiece in a vacuum plasma processing chamber having a non-magnetic member including the metal in the chamber and a metal wall at reference potential. The method comprises reactively coupling AC electromagnetic fields to and through the member and to ions in the chamber while maintaining the member at a potential different from the reference potential to form in the chamber a plasma including ions of the metal from the member. Because the metal member has high electrical conductivity, the voltage across the entire member is substantially the same, causing approximately uniform metal sputtering from all regions of the member. The metal ions in the plasma are attracted to the workpiece, preferably by biasing the workpiece holder. The member desirably consists essentially of the metal to provide a very pure deposit on the workpiece.

Preferably, an inert ionizable gas is supplied to the chamber while the AC field, in the form of an r.f. field derived from a coil outside the chamber, is coupled to the chamber. The ionizable gas is converted into a high density plasma by the r.f. field. The r.f. field which establishes the high density plasma is derived by applying a relatively high amount of r.f. power, about 1 kilowatt, to the coil. The high density plasma leads directly to high deposition rates of the metal on a workpiece and occurs because the magnetic field from the coil is efficiently coupled from the air dielectric outside the chamber through the high dielectric window.

The supply of the inert ionizable gas to the chamber is stopped after the plasma has been ignited. Thereby, the plasma consists essentially only of ions of the metal after the supply of the inert ionizable gas has been stopped. To maintain the plasma after the inert gas is no longer flowing into the chamber, the potential applied to the member is preferably increased as the inert gas supply is stopped.

Metal ions derived from the non-magnetic metal member in the chamber which are in the plasma have a tendency to be deposited on the window. The metal ions deposited on the window are preferably removed from the window at substantially the same time as they are deposited. The metal ions are removed by applying a voltage different from the reference potential to a second non-magnetic metal member between the non-magnetic metal member inside the chamber and the coil. The voltage applied to the non-magnetic metal member inside the chamber or to the second non-magnetic metal member causes the metal ions to be sputtered from the window. Ions from materials on the workpiece, typically polymers from evaporated photoresist, also have a tendency to be deposited on the window. These ions are in the plasma and are removed by essentially the same sputtering process as is used for the metal ions.

The metal and other materials which tend to cloud the window are sputtered from the window in response to isotropic ions in the plasma bombarding the window interior face. The isotropic ions are attracted by the electric field established by the metal member. If the metal member is inside the chamber, the isotropic ions pass through the openings in the metal member which disrupt eddy currents as a result of the electric field established by the portion of the metal member on the outside of the window overlapping the openings on the inner metal member.

Another aspect of the invention relates to a method of igniting an ionizable gas to a plasma in a vacuum plasma chamber having a metal wall at a reference potential. The ionizable gas is supplied to the chamber while (a) a coil supplies an RF field to the gas, and (b) a non-magnetic metal member constructed and arranged to pass an RF electromagnetic field from the coil to the gas and located between the coil and the ionizable gas in the chamber has a voltage different from the reference potential applied to it. The magnitudes of the RF field and the voltage applied to the member establish an electric field in the gas of sufficient magnitude to ignite the gas into a plasma. The member can be either inside or outside the chamber. When the member is outside the chamber the coil is also outside the chamber. The RF field is coupled from the coil outside the chamber through a window in the chamber to the gas in the chamber and the member outside the chamber supplies an electric field to the gas. The metal member outside the chamber can also be used to sputter materials from the window to keep the window clean.

When the non-magnetic metal member is inside the chamber metal can also be sputtered into the plasma in response to excitation by the RF field and the plasma so the metal is deposited on the workpiece. In such a case, the supply of the inert ionizable gas to the chamber can be terminated while metal sputtering into the plasma occurs.

An additional aspect of the invention concerns a method of stabilizing an RF coil excited plasma in a vacuum chamber having a metal wall at a reference potential, wherein the RF coil excited plasma has a tendency to be unstable. The method includes supplying an RF voltage different from the reference potential to a non-magnetic metal member constructed and arranged to pass to the plasma an RF magnetic field derived from a coil exciting the plasma. The member is located between the exciting coil and the plasma. The voltage and the member cause a substantially uniform RF potential to be established on a solid dielectric face in the chamber. The substantially uniform RF potential substantially uniformly capacitively couples an RF stabilizing current to the plasma, to at least partially overcome the unstable tendency of the RF coil excited plasma.

Preferably, the coil and non-magnetic metal member are outside the chamber. The coil derives an RF magnetic field that is coupled to the plasma via the non-magnetic metal member and a dielectric window in the chamber. The dielectric face is a face of the window inside the chamber.

Another aspect of the invention relates to a method of cleaning a dielectric window of a vacuum plasma chamber having a metal wall at a reference potential. The plasma in the chamber is excited by RF electromagnetic fields derived by a coil outside the chamber and passed to the plasma via the dielectric window. The plasma causes material to be deposited on the window. The deposited material is sputtered from the window by applying a voltage different from the reference potential to a non-magnetic metal member outside the chamber between the coil and window. The non-magnetic metal member is arranged and constructed to couple the RF field derived from the coil to the plasma. Voltage applied to the metal member outside the chamber can be an AC or DC voltage and can have a fixed or variable root mean square (RMS) value.

In one aspect, sputtering of the window occurs substantially at the same time as processing of workpieces in the chamber. The workpiece frequently includes a polymer that is deposited on the window during workpiece processing. The polymer deposited on the window during workpiece processing is sputtered from the window. The plasma also can include a metal that is deposited on the workpiece and on the window during workpiece processing; in such a case the metal is sputtered from the window.

Sandhu, U.S. Pat. No. 5,523,261, discloses an arrangement wherein a vacuum plasma processor (including an inductive coil for plasma excitation) is cleaned by establishing an electric field in the plasma processing chamber. The electric field is established between a solid first electrode in the chamber and a second electrode including a liquid metal located in a void between a pair of non-metallic structures. The electric field is established only while the coil is decoupled from the plasma. The second electrode is formed either of a conductive liquid, such as mercury, or a material, such as a polymer, having a conductivity that can be varied by a few orders of magnitude in response to an external energy source such as heat, light or ultrasonic energy. The second electrode, however, cannot pass the magnetic field derived from the coil which is on an outer wall of the chamber. Consequently, the chamber cannot be cleaned during processing of workpieces. In addition, the structure of the Sandhu patent is relatively complex and requires either selective insertion and removal of a conductive liquid or application of energy from an external source to a material in the void.

Johnson, U.S. Pat. No. 5,234,529, and Donohoe, U.S. Pat. No. 5,449,433, disclose plasma generators including a coil for deriving an r.f. field coupled through a dielectric window and an electrostatic shield to a plasma in a vacuum chamber. The shield is at the same reference potential as a grounded metal wall of the processor. Consequently, the devices disclosed by Johnson and Donohoe do not provide the benefits of plasma stabilization, plasma ignition, dielectric window cleaning, or metal plasma formation achieved by the present invention.

The above and still further objects, features and advantages of the present invention will become apparent upon consideration of the following detailed descriptions of several specific embodiments thereof, especially when taken in conjunction with the accompanying drawings.

DESCRIPTION OF THE PREFERRED EMBODIMENT

Figure 1:
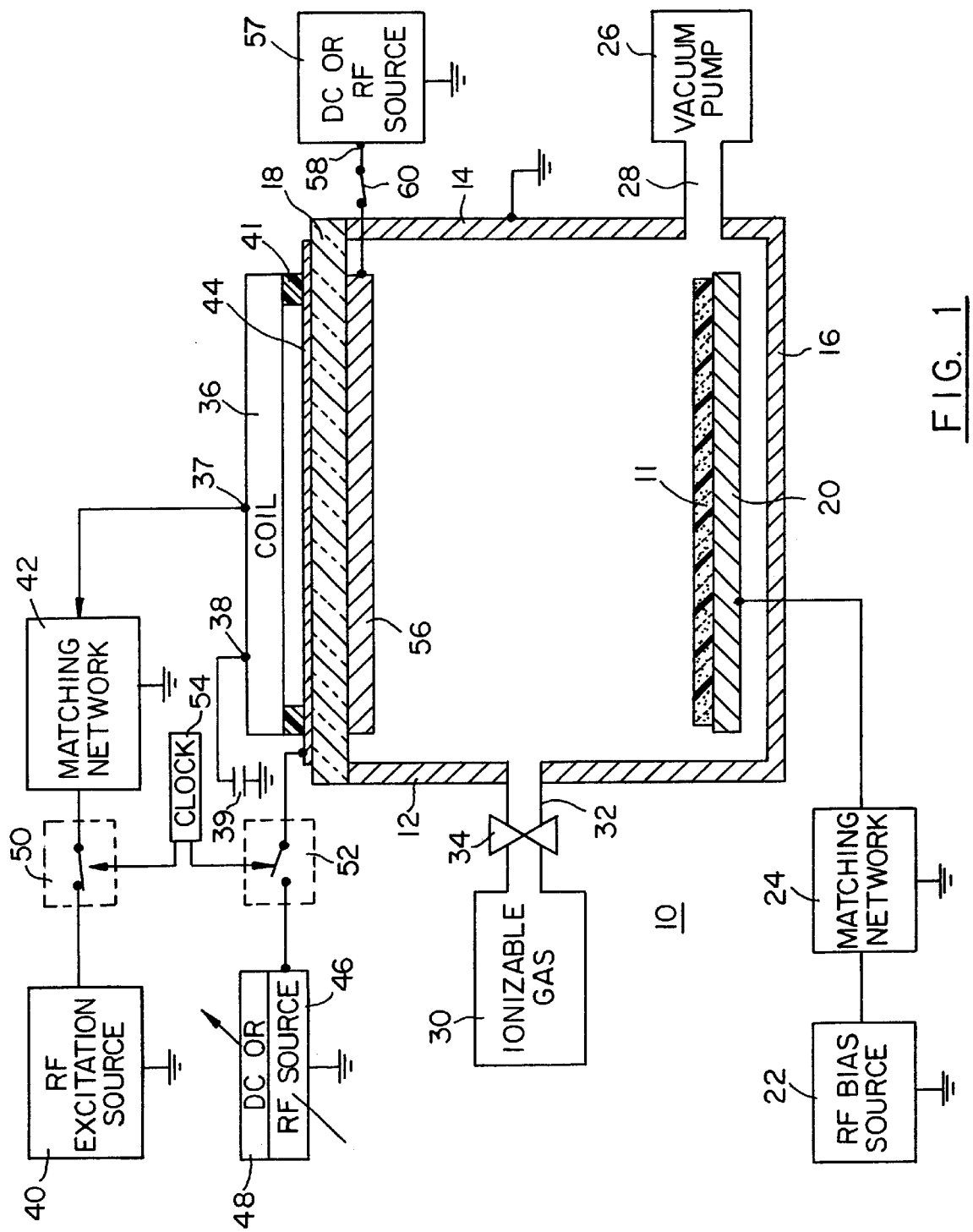
FIG. 1 is a partial physical and partial block diagram of a preferred embodiment of the present invention.

The plasma device of FIG. 1 comprises a vacuum plasma processor 10 for etching materials from and depositing materials onto workpieces 11, typically circular semiconductor wafers or rectangular glass plates used for flat panel displays. Processor 10 includes vacuum chamber 12 having metal side walls 14 and metal base 16, as well as a roof formed of dielectric (typically quartz) window 18 that is transparent to electromagnetic fields. Metal walls 14 and metal base 16 are at ground, i.e., reference, potential. Workpiece 11 is mounted on metal workpiece holder 20 in chamber 12 close to base 16, opposite from window 18. A coolant source, conduit arrangement and a plenum in holder 20 (none shown) typically cool the back face of substrate 11, i.e., the face of the substrate not exposed to plasma in chamber 12. A chuck arrangement (not shown) clamps workpiece 11 to holder 20. R.f. bias source 22, preferably having a frequency of 13.56 MHz, applies an r.f. bias voltage to holder 20 via matching network 24, whereby the workpiece is effectively biased to the voltage of source 22 so charge particles in vacuum chamber 12 are attracted to the workpiece. Vacuum pump 26, connected to the interior chamber 12 by line 28, evacuates the interior of the vacuum chamber to a suitable low pressure, in the milliTorr range. Gas source 30 selectively supplies ionized gas to the interior of chamber 12 via valve 34 in line 32. For certain types of processing of workpieces 11, the gas of source 30 is an inert ionizable gas, preferably argon, although helium, neon and other inert ionizable gases can be used. The ionizable gas of source 30 can also be reactive, for example, sulphur hexofluoride ($SF_6$), which is used to etch polymer resists from workpiece 11.

Coil 36, mounted above and spaced from the top, outer face of window 18, excites material in the interior of chamber 12 into a plasma. Coil 36 has a peripheral shape and size generally corresponding to the peripheral shape and size of workpiece 11. Plastic spacer 41 separates the lower face of coil 36 approximately one inch from the top face of window 18.

R.f. source 40, preferably having a frequency of 13.56 MHz, powers coil 36 via matching network 42. Network 42 includes variable reactors having automatically controlled values to attain an impedance match between output terminals of excitation source 40 and its load including coil 36 and the variable impedance of plasma in chamber 12. Coil 36 responds to the r.f. power from source 40 to supply electric and magnetic fields to the interior of chamber 12 via window 18, to excite ionizable particles in chamber 12 to a plasma. The ionizable particles are frequently molecules from ionizable gas source 30. However, in accordance with one aspect of the invention, the particles are non-magnetic metal ions derived by sputtering the metal from a target inside chamber 12.

Coil 36 is preferably configured as a spiral having circular turns, or as a "square" spiral having turns defined by adjacent segments that extend radially and circumferentially and are at right angles to each other. In either case, coil 36 has a center terminal 37, connected to an output terminal of matching network 42 and exterior terminal 38 connected to ground via capacitor 39. Coil 36 has sufficient length relative to the frequency of source 40, such that the coil has transmission line effects between terminals 37 and 38, so there is at least one voltage maximum and one voltage minimum along the length of the coil. Typically, the voltage maximum is at the center terminal 37 and the voltage minimum is at some intermediate point between terminals 37 and 38. The foregoing structures are generally known to those of ordinary skill in the art and need not be further described.

According to one aspect of the invention, a non-magnetic, high electrical conductivity metal member is adjacent at least one of the top or bottom faces of window 18 and is powered via a connection to a voltage terminal at a potential different from the ground potential of metal walls 14 and base 16. The metal member on the top window face or in the chamber abutting the window bottom face consists essentially of a high conductivity, non-magnetic metal, such as copper, although other non-magnetic high conductivity metals can be used. The metal member on the top window face is usually copper or aluminum. The non-magnetic members are configured to pass the electric and magnetic fields derived from coil 36 to the interior of chamber 12.

The non-magnetic metal member on the upper, exterior face of window 18 is copper or aluminum thin film 44, connected to non-grounded output terminal 46 of source 48. Source 48, for certain applications, is a DC source and for other applications is an r.f. source. For some applications, the root mean square (RMS) voltage derived from source 48 is fixed, while for other purposes, the voltage source 48 supplies to its output terminal 46 a variable, controlled RMS value. For certain window cleaning applications, sources 40 and 48 are connected to coil 36 and thin metal film 44 at mutually exclusive times, a result achieved by connecting the output terminals of sources 40 and 48 to matching network 42 and film 44 via switches 50 and 52, respectively. Switches 50 and 52 can be connected and disconnected at mutually exclusive times in response to out-of-phase outputs of clock source 54.

The non-magnetic metal member on the lower, inside face of dielectric window 18 consists essentially of metal plate 56. According to one aspect of the invention, metal plate 56 is made of a non-magnetic metal to be sputtered onto the exposed, upper face of workpiece 11. Since material is sputtered from metal plate 56, the plate is considered to be a consumable target initially having substantial thickness. Source 57, which can be either a DC or r.f. source, has an ungrounded output terminal 58 for powering plate 56 so the plate is at a potential substantially different from grounded metal wall 14 and base 16 of chamber 12. If thin film 44 and plate 56 are both included in processor 10, which is not necessarily the case, the voltages from sources 48 and 57 need not be simultaneously applied to the film and plate.

Terminal 58 is connected to plate 56 via switch 60. Switch 60 can be closed while switch 52 is closed, in which case, film 44 and plate 56 are simultaneously powered. Alternatively, switches 52 and 60 are closed and opened at the same time. Switch 52, when open, connects film 44 to ground while plate 56 is powered. Similarly, but in an opposite manner, when switch 52 is closed, switch 60 connects plate 56 to ground.

Figure 2:
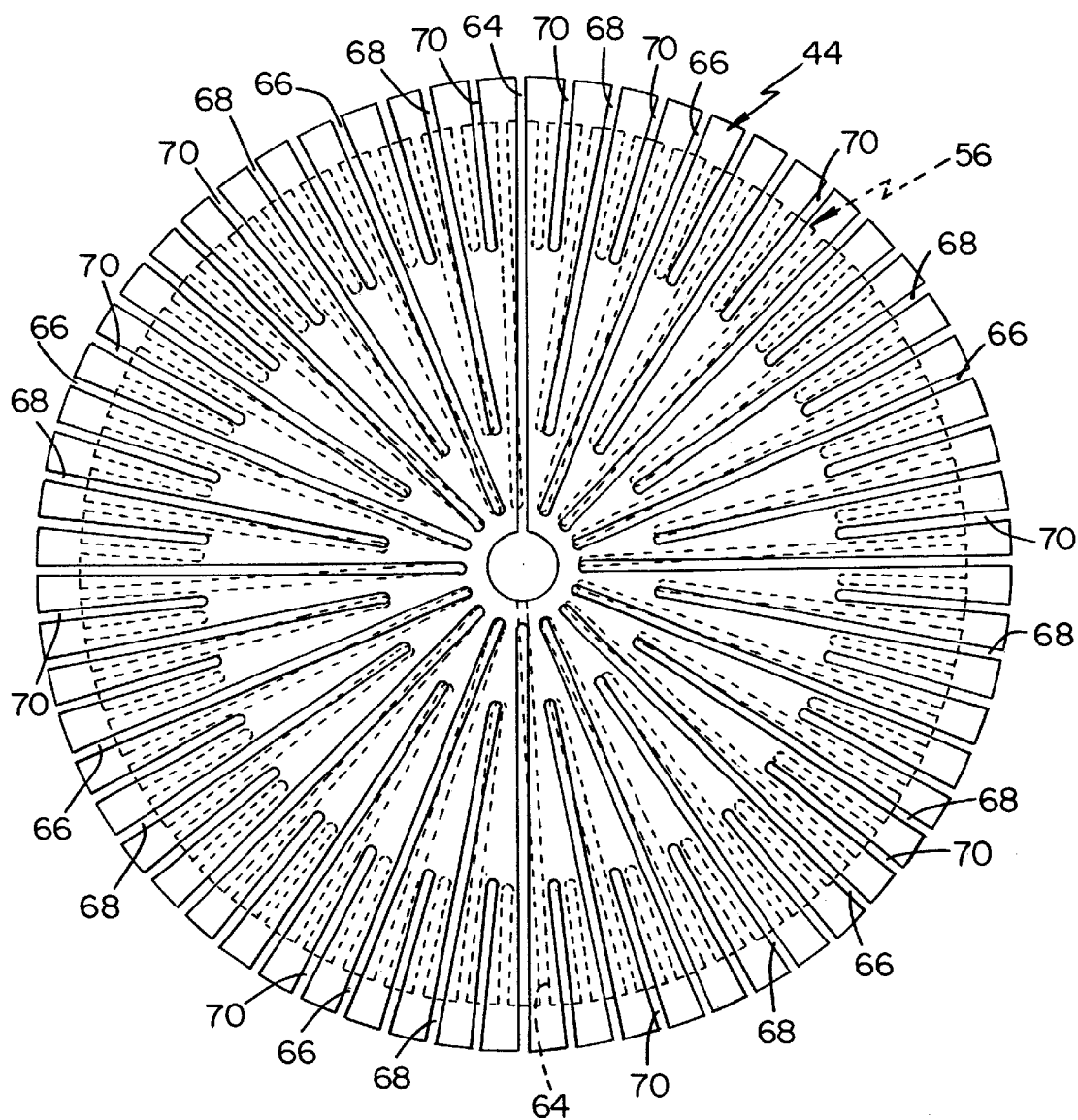
FIG. 2 is a top view of a pair of non-magnetic metal members employed in the apparatus illustrated in FIG. 1.

FIG. 2 is an illustration of a top view of a preferred configuration of film 44 and plate 56. Each of film 44 and plate 56 has a configuration to disrupt eddy currents which would otherwise flow in these non-magnetic metal members. If eddy currents were to flow in film 44 or plate 56, they would substantially prevent inductive coupling of magnetic fields from coil 36 to the plasma in chamber 12.

Each of film 44 and plate 56 has substantially the same top view shape, as illustrated in FIG. 2. Film 44 has a substantially circular periphery having a diameter approximately equal to the space between the interior sides of walls 14. Plate 56 has a diameter somewhat less than that of film 44 so the periphery of plate 56 is spaced from walls 14 by a sufficient distance to prevent arcing between them. Since film 44 and plate 56 have the same shape, the description of film 44 suffices for plate 56.

Film 44 has 64 radially extending slots, as well as a circular center interior opening 62. The radially extending slots have four lengths, with slot 64 extending from inner opening 62 to the periphery of the film. Fifteen slots 66 of film 44 extend from the periphery of the film almost to the outer diameter of central opening 62. Slots 64 and 66, together, are equally spaced in an arcuate manner from each other about the center of film 44, such that slots 64 and 66 are spaced from each other by approximately 22.5 degrees. Equally spaced between each adjacent pair of slots 66 are slots 68, each having a radial extent from the periphery of film 44 somewhat less than the radial extent of slot 66. Relatively short radially extending slots 70 are located between adjacent S pairs of slots 66 and 68 or adjacent pairs of slots 64 and 68.

Plate 56 is coaxial with film 44, but is oriented so that the radially extending fingers between adjacent slots of film 44 overlap each of the slots of plate 56. Further, the slot of plate 56 corresponding with slot 64 is displaced approximately 185.625 degrees from slot 64 of film 44. The stated arrangement of film 44 and plate 56 enables the plate to have substantial mechanical rigidity, while providing effective coupling of magnetic fields from coil 36 to the plasma in chamber 12 and coupling of electric fields from film 44 through the slots of plate 56 to the plasma in chamber 12. Film 44 and plate 56 can have any other suitable configuration which enables them to pass electromagnetic fields from coil 36 to the plasma in chamber 12.

Figure 3:
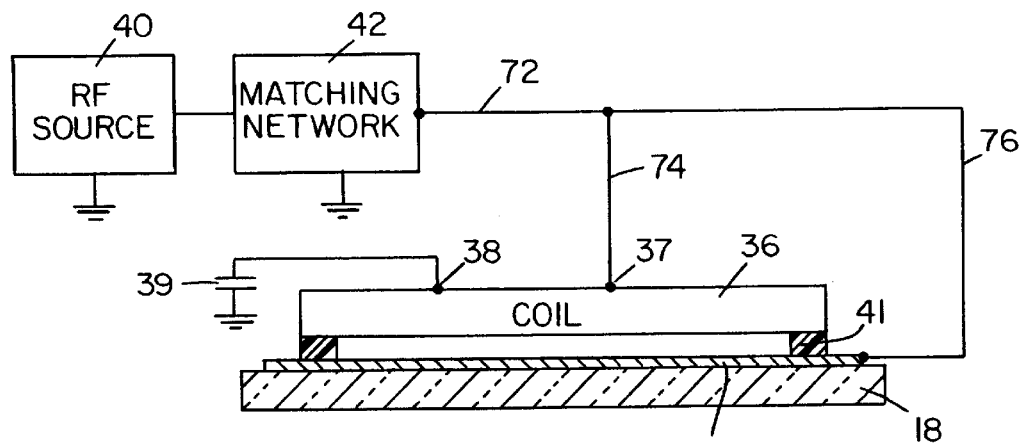
FIG. 3 is a partial schematic and partial physical diagram of electrical connections for a coil and metal film on a window external face, in accordance with another embodiment of the invention.
Figure 4:
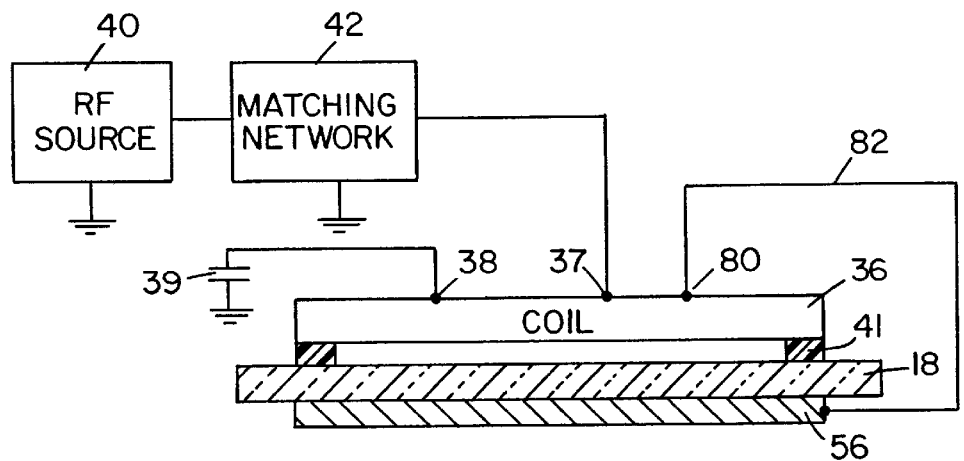
FIG. 4 is a partial schematic and partial physical diagram of electrical connections to a coil and a non-magnetic metal plate inside a vacuum plasma processor, in accordance with a further embodiment of the invention.
Figure 5:
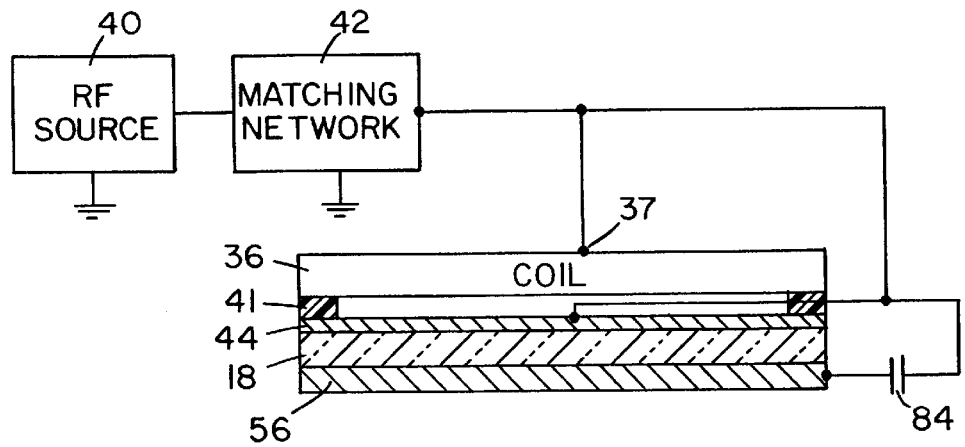
FIG. 5 is a partial schematic and partial physical diagram of electrical connections to a coil and a pair of non-magnetic metal members respectively located inside and outside a vacuum plasma processor in accordance with an additional embodiment of the invention.

Various electrical connections for coil 36, metal film 44 and plate 56 are illustrated in FIGS. 3, 4 and 5. In FIG. 3, coil 36 and film 44 are driven directly by the r.f. voltage of matching network 42 by virtue of the matching network being connected through cable 72 and leads 74 and 76, respectively connected to center terminal 37 of coil 36 and the surface of film 44. Thereby, film 44 is maintained at the same relatively high r.f. voltage as center terminal 37 of coil 36. Typically, leads 74 and 76 are metal straps connected to cable 72.

Because of the transmission line effects of coil 36, there is a tendency for high, low and even zero voltage regions to subsist on the interior face of window 18, unless metal film 44 is provided. The relatively high voltage applied to film 44, whether it be AC, as illustrated in FIG. 3, or DC, as illustrated in FIG. 1, maintains the entire film at substantially the same high voltage because the film has high electrical conductivity. Because all of metal film 44 is at a relatively high voltage, the tendency of coil 36 to produce zero or low voltages on certain interior regions of window 18 is overcome. In effect, film 44 serves as an AC powered Faraday shield to overcome the tendency for window 18 to have zero or low voltage regions. Since there are no low voltage regions on window 18, any material that would otherwise have a tendency to be attracted to the window is repelled from or sputtered from the window interior. Thereby, if chamber 12 is used to etch polymer photoresist from workpiece 11, the photoresist does not adhere to (1) the interior face of window 18 if the lower face of window 18 is not covered by plate 56 or (2) metal plate 56, if the metal plate abuts or is adjacent the window interior face. Further, if chamber 12 is used to deposit metals onto workpiece 11, the metals that might be attracted to the low voltage regions of window 18 are repelled from or sputtered off the window interior face as a result of the relatively high voltage applied to the window by metal film 44.

Metal film 44 also helps to stabilize the plasma in chamber 12. In the configuration of FIG. 3 wherein metal plate 56 is not included, metal film 44 on the outer face of window 18 adds a small amount of capacitively coupled r.f. power to the plasma discharge in chamber 12. Since metal film 44 effectively functions as a powered Faraday shield, the film supplies a uniform potential through window 18 to the plasma in chamber 12. The potential established by film 44 on the interior face of window 18 differs substantially from the ground potential of walls 14 and base 16 to provide uniform coupling of a small amount of r.f. current to all portions of the interior window face directly under the metal film. This relatively small capacitively coupled current which originates in source 40 and flows through network 42 stabilizes the predominantly inductively coupled discharge from coil 36 to the plasma in chamber 12. This current improves plasma stability and overcomes the relatively large impedance fluctuations of the plasma which result from the magnetic field from coil 36 exciting relatively low energy electrons in the plasma. The electric field metal film 44 establishes on the interior of window 18 operates on relatively high energy electrons, to provide the stated stabilization.

Typically, the voltage established on the interior face of window 18 in the FIG. 3 configuration is approximately 100 volts peak to peak r.f., a result achieved by applying approximately 2 kilovolts peak to peak to film 44. The uniform potential established on the interior face of window 18, as a result of capacitive coupling from film 44 through the window to the window interior face, causes uniform sputtering of any material that may be deposited on the exposed window interior face during processing of workpiece 11.

The voltage supplied to film 44 can be fixed for this purpose, or can be variable, as indicated by source 48, FIG. 1. By adjusting the voltage applied to film 44, window 18 can be kept clean during processing. The voltage applied to film 44 is controlled so it is low enough to avoid arcing in chamber 12 and prevent erosion of window 18. However, the voltage applied to film 44 must be adjusted to be sufficiently large to cause the sputtering rate of material from the window interior face to approximately equal the deposition rate of material on the window interior face. Coil 36 and film 44 can be powered simultaneously. Alternatively, coil 36 and film 44 can be energized at different sequential times, by activating switches 40 and 52, so that processing operations of workpiece 11 occur in chamber 12 during one relatively short time interval, followed by a relatively short cleaning operation, which in turn is followed by another processing operation. Alternatively, film 44 can be powered to sputter material from window 18 during an overall cleaning process for the interior of chamber 12.

In the configuration of FIG. 4, metal plate 56, in the interior of chamber 12 and abutting the interior face of window 18, has a lower voltage than the voltage applied to center terminal 37 of coil 36 by r.f. source 40 and matching network 42. To this end, coil 36 includes an intermediate tap 80, at a low voltage point along coil 36, between terminals 37 and 38. Tap 80 supplies a relatively low r.f. voltage to plate 56 via copper strap 82. The r.f. voltage applied to plate 56 maintains all areas of the high electrical conductivity plate at substantially the same r.f. potential.

The uniform r.f. potential applied to plate 56 is advantageously used to assist in obtaining plasma ignition in chamber 12. By the same token, applying an r.f. voltage to metal film 44 assists in establishing ignition of the plasma in chamber 12. To initiate the plasma, an ionizable gas from source 30 is fed into chamber via line 32 and valve 34. For certain applications, particularly when workpiece 11 has material deposited on it, the ionizable gas is an inert gas which flows into the interior chamber 12 only until plasma ignition has occurred. Then, valve 34 is closed and the inert ionizable gas flow into chamber 12 stops.

The configuration of FIG. 4 can be employed to deposit the non-magnetic metal of plate 56 onto substrate 11. In such an application, metal is sputtered from plate 56 after the inert gas from source 30 has been ionized. The metal sputtered from plate 56 is ionized by the electric and magnetic fields coupled from coil 36 through window 18. It is important for the upper face of plate 56 to abut window 18, to prevent the window from being clouded by metal sputtered from plate 56. To overcome any tendency of the metal from plate 56 clouding window 18, the window can be sputtered by powered metal film 44. Because plate 56 consists essentially only of the metal desired to be deposited on workpiece 11, and it is undesirable to deposit other materials onto the substrate while the metal is being deposited thereon, valve 34 is typically closed after the plasma in chamber 12 has been ignited during a metal deposition process. To establish the plasma discharge while the inert ionizable gas is in the chamber, an r.f. peak to peak voltage of about 200 volts is initially applied to plate 56. After the plasma discharge has been established, metal is sputtered from target plate 56 and then the inert gas flow is cut off simultaneously with the peak to peak r.f. voltage applied to the plate increasing to about 500 volts. The increased r.f. voltage on plate 56 is necessary because the inert gas is not in the chamber and the plasma must be sustained only by ions sputtered from the plate.

For deposition purposes, plate 56 is preferably formed of copper, but it is to be understood that other high electrical conductivity, non-magnetic metals, such as gold, silver, aluminum, palladium, tantalum or tungsten, can be employed, depending on the film desired to be deposited on substrate 11.

FIG. 5 is a circuit diagram of another arrangement for supplying a relatively low r.f. potential to metal plate 56, while supplying a higher voltage to metal film 44. In the circuit of FIG. 5, r.f. source 40 supplies relatively high voltage to center terminal 37 of coil 36 and to film 44, while a lower voltage is supplied to plate 56 by connecting the output terminal of matching network 42 to the plate via capacitor 84. Prior to ignition of a plasma in chamber 12, capacitor 84 and the capacitive impedance of plate 56 and metal wall 14 establish a capacitive voltage divider having a tap at plate 56. After the plasma discharge in chamber 12 has been established, a voltage divider for plate 56 comprises capacitor 84 and the predominantly resistive impedance of the plasma in chamber 12. Hence, prior to plasma ignition, a relatively high percentage of the applied r.f. voltage is coupled to plate 56, but a significantly smaller percentage of the applied r.f. voltage is coupled to the plate once plasma ignition in chamber 12 occurs. To obtain the voltage necessary to sustain the sputtering of metal after the inert gas flow has stopped, the r.f. voltage of source 40 must be appreciably increased as the flow of inert ionizable gas into chamber 12 from source 30 stops.

Figure 6:
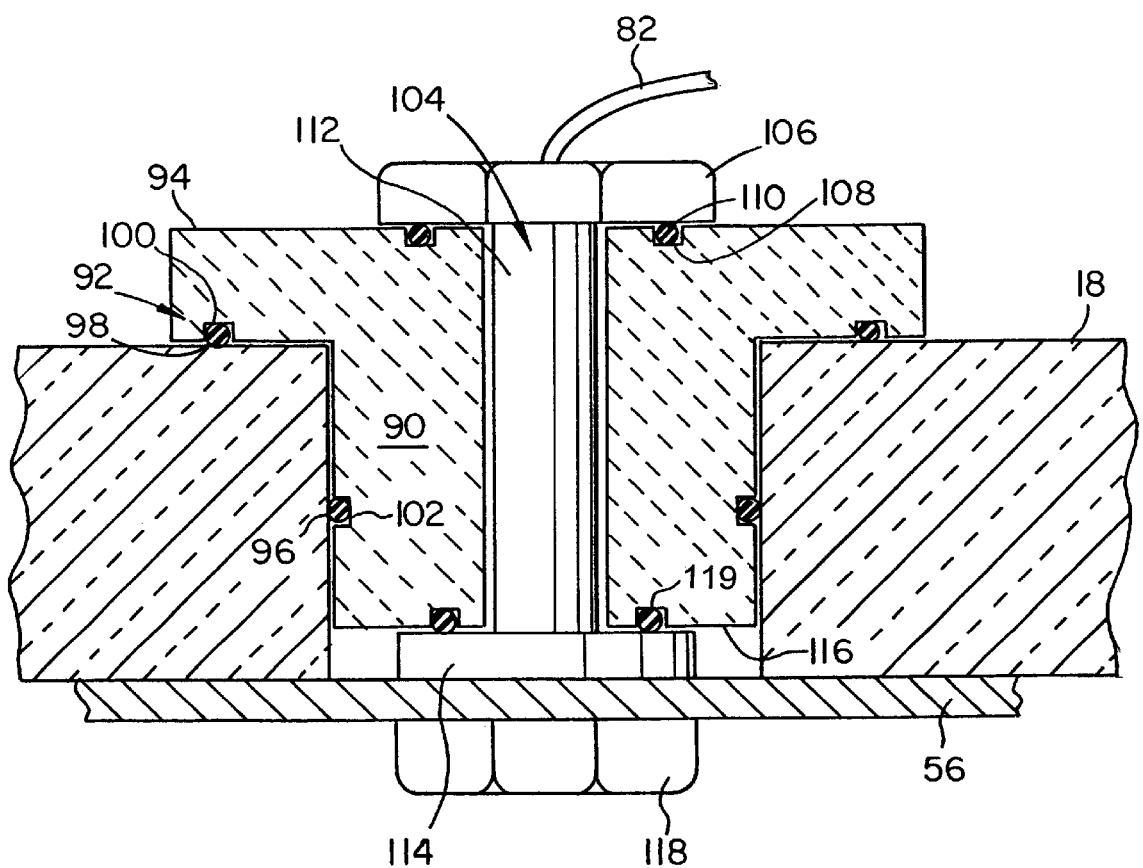
FIG. 6 is a detailed view of a portion of the apparatus illustrated in FIG. 1.

FIG. 6, a detailed cross sectional view of a portion of the structure illustrated in FIG. 4, includes quartz window 18, non-magnetic metal plate 56 and copper strap 82 connected to low voltage terminal 80 of coil 36. Window 18 has a central bore which receives tubular body 90 of ceramic block 92, having a disc shaped upper flange 94. The bottom face of flange 94 and the outer wall of body 90 respectively abut the upper face and side wall of a central bore of quartz window 18. A vacuum seal is established between block 92 and window 18 by gaskets 96 and 98, respectively in grooves 100 and 102 in the side wall of body 90 and the bottom face of flange 94.

An electrical connection is established between copper strap 82 and plate 56 by bolt 104, formed of a high conductivity metal such as copper or aluminum. Bolt 104 includes head 106, having a lower face abutting the upper face of flange 94, including groove 108 containing gasket 110 forming a vacuum seal. Head 106 includes an upper face soldered to copper strap 82. Bolt 104 includes threaded shaft 112 which fits through a longitudinally extended bore in block 92, such that the shaft extends beyond the lower face of body 90 and through the central, circular opening in plate 56. Metal spring washer 114 surrounds shaft 112 in a gap between the lower face of body 90 and the upper face of plate 56. A vacuum seal is established between washer 114 and the gap by gasket 116 which fits into groove 119 in the lower face of body 90. Nut 120 is threaded onto shaft 112 so the nut abuts the lower face of plate 56, to force the upper face of plate 56 against the lower faces of quartz window 18 and washer 114. Bolt 104, washer 114 and nut 118 are all preferably made of the same non-magnetic metal to eliminate adverse effects which can occur from different metals contacting each other. If possible these components are the same metal as the metal of plate 56.

The described construction enables new plates 56 to be selectively placed on the lower face of window 18. Since plate 56 is consumed during sputtering operations involving deposition of metal from the plate onto the exposed face of workpiece 11, the arrangement of spring washer 114 and nut 118 is convenient for renewing metal deposition sources and maintaining the plate upper face in abutment with the window 18 lower face. Abutting the top face of plate 56 against the lower face of window 18 substantially reduces the likelihood of charge particles in vacuum chamber 12 being incident on and contaminating the window.

While there have been described and illustrated several specific embodiments of the invention, it will be clear that variations in the details of the embodiments specifically illustrated and described may be made without departing from the true spirit and scope of the invention as defined in the appended claims. For example, for certain applications, coil 36 can be replaced by a microwave excitation source for the plasma in chamber 12. In both situations, energy is reactively coupled from an AC source to ionizable material in a vacuum chamber to form a plasma.

What is claimed:

1. A plasma device comprising a vacuum chamber having a metal wall at a reference potential and a dielectric window, an AC excitation source for reactively coupling AC energy to the chamber, the AC excitation source including a coil having connections to be powered by an AC source, the coil being outside the chamber and arranged to derive an AC field coupled to the plasma through the dielectric window of the chamber, the AC energy when coupled to the chamber from the source being capable of interacting with ionizable material in the chamber to form a plasma, and a non-magnetic metal member interposed between the coil and the plasma, the non-magnetic metal member being arranged and constructed to pass AC electromagnetic fields from the coil to the plasma, the non-magnetic metal member being connected to a terminal of an electric source at a potential different from the reference potential.

2. The plasma device of claim 1 wherein the device is a processor for a workpiece, the chamber including a holder for the workpiece, whereby the workpiece on the holder is processed by the plasma.

3. The plasma device of claim 1 wherein the non-magnetic metal member is inside the chamber.

4. The plasma device of claim 3 wherein the non-magnetic metal member comprises a consumable solid mounted for replacement in the chamber.

5. The plasma device of claim 3 wherein the non-magnetic metal member abuts the window.

6. The plasma device of claim 5 wherein the non-magnetic metal member comprises a consumable solid mounted for replacement in the chamber.

7. The plasma device of claim 3 wherein the electric source is an AC source so the terminal is at a potential that varies with respect to the reference potential.

8. The plasma device of claim 1 wherein the non-magnetic metal member is outside the chamber.

9. The plasma device of claim 8 wherein the electric source is an AC source so the terminal is at a potential that varies with respect to the reference potential.

10. The plasma device of claim 8 wherein the non-magnetic metal member abuts the window.

11. The plasma device of claim 10 wherein the non-magnetic metal member comprises a film on the window.

12. The plasma device of claim 8 wherein the electric source enables the terminal to be at variable RMS potentials.

13. The plasma device of claim 8 wherein the electric source causes the terminal to be at a DC potential relative to the reference potential.

14. The plasma device of claim 8 wherein the electric source causes the terminal to be at an AC voltage relative to the reference potential.

15. The plasma device of claim 1 wherein first and second of said non-magnetic members are included, the first non-magnetic member being inside the chamber, the second non-magnetic member being outside the chamber.

16. The plasma device of claim 15 wherein said first and second non-magnetic members include openings for disrupting eddy currents having a tendency to flow therein in response to magnetic fields derived by the coil.

17. The plasma device of claim 16 wherein the openings on the first and second members are non-aligned.

18. The plasma device of claim 15 wherein the first and second non-magnetic members are connected to electric source terminals for causing the first non-magnetic metal member to be at a first potential relative to the reference potential and the second non-magnetic member to be at a second potential relative to the reference potential, wherein the first potential is substantially greater than the second potential.

19. The plasma device of claim 18 wherein the first non-magnetic metal member is at an AC potential substantially the same as a high voltage point of the coil and the second non-magnetic metal member is at an AC potential substantially the same as a low voltage point of the coil.

20. The plasma device of claim 19 further including first and second metal bus bars respectively connected between (a) the first non-magnetic metal member and the high voltage point of the coil and (b) the second non-magnetic metal member and the low voltage point of the coil.

21. The plasma device of claim 18 further including a switching arrangement for causing the first and second potentials to be applied to the first and second non-magnetic members at mutually exclusive times.

22. The plasma device of claim 18 wherein the electric source includes an AC source having an output terminal connected to the first non-magnetic metal member and in series with a first electrode of a capacitor having a second electrode connected to the second non-magnetic metal member.

23. The plasma device of claim 15 wherein the first and second non-magnetic members are connected to electric source terminals for causing the first non-magnetic metal member to be at a first potential relative to the reference potential and the second non-magnetic member to be at a second potential relative to the reference potential, wherein the first potential is substantially greater than the second potential which can have a variable RMS amplitude.

24. The plasma device of claim 1 wherein the chamber and excitation source are arranged so the AC energy is coupled through a roof of the chamber.

25. The plasma device of claim 1 wherein the coil is substantially planar and derives an RF field coupled to the plasma through the dielectric window, the dielectric window being in a roof of the chamber.

26. A plasma device comprising a power supply arrangement having plural terminals for deriving (a) a reference potential, (b) an AC voltage, and (c) a voltage which differs from the reference potential, a vacuum chamber having a dielectric window and a metal wall for connection to the terminal for deriving the reference potential, an AC excitation source for connection to the terminal for deriving the AC voltage and for reactively coupling AC energy to the chamber, the AC excitation source including a coil having connections to be powered by an AC source, the coil being outside the chamber and arranged to derive an AC field coupled to the plasma through the dielectric window of the chamber, the AC energy when coupled to the chamber being capable of interacting with ionizable material in the chamber to form a plasma, and a non-magnetic metal member for connection to the terminal for deriving the voltage which differs from the reference potential, the non-magnetic member being interposed between the coil and the plasma, the non-magnetic metal member being arranged and constructed to pass the energy from the coil to the plasma.

27. The plasma device of claim 26 wherein the chamber and excitation source are arranged so the AC energy is coupled through a roof of the chamber.

* * * * *